（12）United States Patent
Brunel et al.

(10) Patent No.: US 7,245,889 B2
(45) Date of Patent: Jul. 17, 2007

(54) SIGNAL SOURCE WITH MULTIPHASE FILTER

(75) Inventors: Dominique Brunel, Caen (FR); Sever Cercelaru, Castagniers (FR)

(73) Assignee: NXP BV., Eindhoven (NL)

( * ) Notice: Subject to any disclaimer, the term of this patent is extended or adjusted under 35 U.S.C. 154(b) by 736 days.

(21) Appl. No.: 09/961,986

(22) Filed: Sep. 24, 2001

(65) Prior Publication Data

US 2002/0081983 A1    Jun. 27, 2002

(30) Foreign Application Priority Data

Sep. 25, 2000   (FR)   .................................. 00 12167

(51) Int. Cl.
   *G06F 3/33*   (2006.01)
(52) U.S. Cl. ...................... 455/130; 455/131; 455/255; 455/260
(58) Field of Classification Search ........ 455/130–131, 455/255, 258–260, 265, 302, 307, 313–318, 455/334, 340, 118, 147, 114.1; 331/1 R, 331/2, 51; 332/117, 123; 327/115, 117
See application file for complete search history.

(56) References Cited

U.S. PATENT DOCUMENTS

| | | | | |
|---|---|---|---|---|
| 5,712,596 A | * | 1/1998 | Van Amesfoort | ............. 331/76 |
| 5,715,529 A | * | 2/1998 | Kianush et al. | ............. 455/266 |
| 6,404,293 B1 | * | 6/2002 | Darabi et al. | ................. 331/37 |
| 6,560,449 B1 | * | 5/2003 | Liu | ............................ 455/302 |
| 6,636,731 B1 | * | 10/2003 | Greer | .......................... 455/307 |
| 6,850,749 B2 | * | 2/2005 | Soorapanth et al. | ........ 455/318 |
| 2002/0021762 A1 | * | 2/2002 | Takagi | ........................ 375/261 |

FOREIGN PATENT DOCUMENTS

| EP | 0926811 A1 | | 6/1999 |
|---|---|---|---|
| GB | 2282303 A | * | 3/1995 |

* cited by examiner

*Primary Examiner*—Melur Ramakrishnaiah

(57) ABSTRACT

The invention relates to a signal source (S) which comprises a local oscillator (5) for generating a reference frequency signal fo. The signal source comprises:
  a frequency divider by N (6) connected to the local oscillator (5) and delivering two quadratic square-wave signals (Id, Qd) at a frequency fo/N, N being equal to 2 or 4×n, and n being an integer number, and
  a multiphase filter (7) which supplies two sinusoidal quadratic signals (Is, Qs) at a frequency equal to m·fo/N on the basis of the quadratic signals (Id, Qd) issued by the frequency divider, m being an odd number.

The invention finds its application in direct frequency conversion circuits and transmission circuits used in the field of telecommunication.

10 Claims, 6 Drawing Sheets

SIGNAL SOURCE WITH MULTIPHASE FILTER

TECHNICAL FIELD AND PRIOR ART

The invention relates to a signal source as well as to a method of forming a signal.

The invention also relates to a frequency conversion circuit as well as a method of converting a frequency, to a signal transmission circuit as well as a method of forming a transmission signal, to a signal transmission/reception circuit, and to a telephone device.

A field of application of the invention is the field of telecommunications such as, for example, the field of cellular telephones.

A frequency converter of the prior art is shown in FIG. 1. The frequency converter comprises a mixer 1 and a local oscillator 2. The mixer 1 receives at a first input (referred to as "signal input" hereinafter) a frequency signal fs containing data to be detected and, at a second input, a frequency signal fo issued by the local oscillator. The useful signal supplied at the output of the mixer is a signal whose frequency is equal to the difference between the frequencies fs and fo.

In the case of a direct conversion of frequency, the frequencies fs and fo are either substantially equal, or are separated by, for example, several hundreds of kHz. The useful information is then delivered either in the form of a continuous signal or in the form of a signal of very low frequency.

A fraction Fa of the signal emitted by the local oscillator can be detected at the signal input of the mixer 1 due to radiation. This detection phenomenon of the signal issued by the local oscillator is generally denoted "self-mixing". Detection through self-mixing leads to the presence of a continuous parasitic signal at the output of the mixer 1, which will be added to the useful signal. Suppressing this parasitic component without changing the useful signal is a very delicate matter which requires complicated and expensive means, particularly in direct frequency conversion devices.

A signal transmission circuit according to the prior art is shown in FIG. 2. The circuit comprises a local oscillator 3 and an amplifier 4. The local oscillator 3 delivers a frequency signal fe which is amplified by the amplifier 4. A fraction Fb of the frequency signal fe delivered by the amplifier 4 is very often radiated and re-transmitted towards the local oscillator, which will then behave as a selective receiver at the frequency fe. The signal thus received by the local oscillator interferes with the conditions for establishing the frequency fe, which accordingly becomes modified. This frequency modification phenomenon under the influence of the circuit for controlling the local oscillator is generally denoted "pulling".

To reduce the pulling effect, it is known to place a frequency divider between the local oscillator and the amplifier. This technique is described in European patent application EP 0 926 811 A1. To maintain the same reference frequency, the frequency of the local oscillator is, for example, multiplied by 2, while the frequency divider divides the frequency of the signal issued by the local oscillator by 2. The signal at the output of the amplifier A contains not only the frequency signal fe but also harmonics of the frequency signal fe. It is accordingly no longer the frequency signal fe which interferes with the conditions for establishing the frequency of the local oscillator, but the second harmonic. The second harmonic has a power level which is very much lower than the power level of the base frequency. The stability of the frequency of the local oscillator is improved thereby, but the pulling problem is still not resolved.

The invention does not have the disadvantages mentioned above.

DESCRIPTION OF THE INVENTION

Indeed, the invention relates to a signal source comprising a local oscillator for generating a reference frequency signal fo. The signal source comprises:

a frequency divider by N connected to the local oscillator and intended to deliver two quadratic square-wave signals at the frequency fo/N, N being equal to 2 or 4·n, n being an integer number, and a ployphrase filter connected to the frequency divider for supplying two sinusoidal quadratic signals at a frequency equal to m·fo/N on the basis of the quadratic signals issued by the frequency divider, m being an odd number.

The invention also relates to a frequency conversion circuit comprising a mixer and a signal source as described above.

The invention further relates to a signal transmission circuit comprising a signal source for supplying a signal at a transmission frequency and an amplifier for amplifying the signal supplied by the signal source which is as described above.

The invention further relates to a transmission/reception circuit comprising a signal transmission circuit and a frequency conversion circuit as described above.

The invention further relates to a telephone device comprising a signal transmission circuit as described hereinbefore or a transmission/reception circuit as described hereinbefore.

The invention further relates to a method of forming two quadratic sinusoidal signals (Is, Qs) from a frequency signal fo. The method comprises:

the formation of two square-wave quadratic signals (Id, Qd) at the frequency fo/N, N being equal to 2 or 4·n, wherein n is an integer number, and the formation of the two sinusoidal quadratic signals (Is, Qs) at a frequency equal to m·fo/N from the two quadratic square-wave signals (Id, Qd), m being an odd number.

The invention further relates to a method for direct conversion of a frequency signal fs into a frequency signal fd, which method comprises:

a method of forming two quadratic sinusoidal signals (Is, Qs) as described above, and a step of mixing each of the two quadratic sinusoidal signals (Is, Qs) with the frequency signal fs so as to deliver the frequency signal fd.

The invention further relates to a method of forming a transmission signal, which method comprises:

a method of forming two quadratic sinusoidal signals (Is, Qs) as described hereinbefore, and a step of amplifying at least one of the two sinusoidal quadratic signals (Is, Qs) so as to form the transmission signal.

The signal source according to the invention delivers a signal whose frequency has no harmonic relationship with the frequency of the local oscillator. The self-mixing and pulling effects are thus advantageously fully suppressed.

SHORT DESCRIPTION OF THE FIGURES

Further characteristics and advantages of the invention will become clear from the description of a preferred embodiment, given with reference to the appended Figures, in which.

Figure 5:
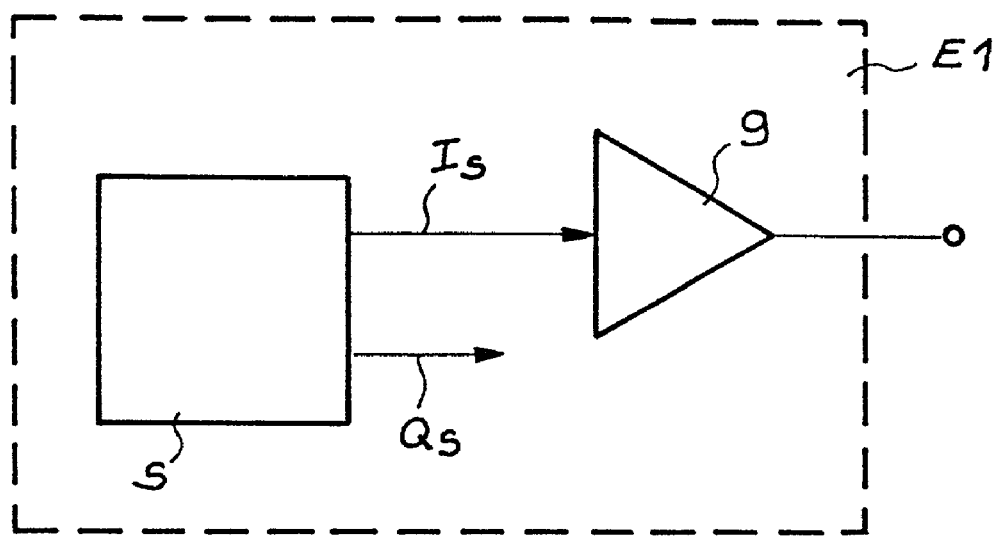
Figure 5:
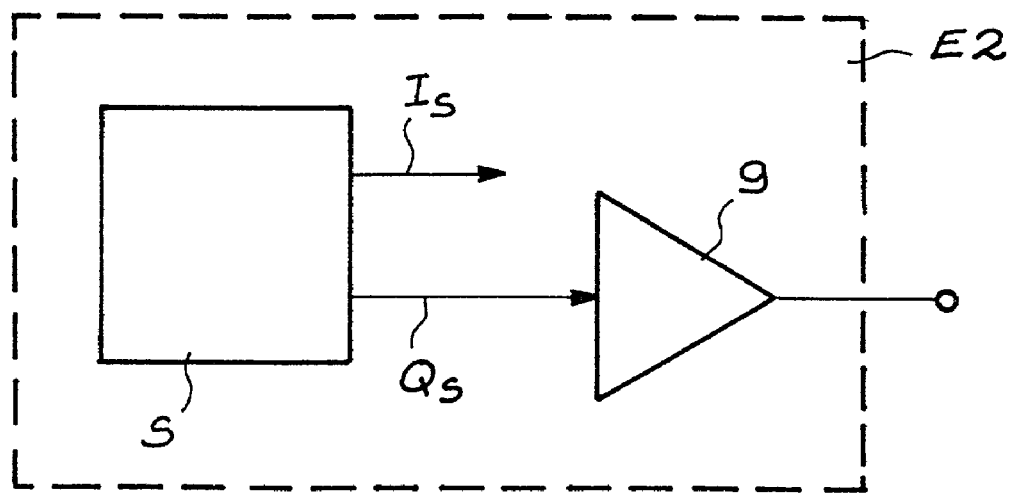
Figure 5:
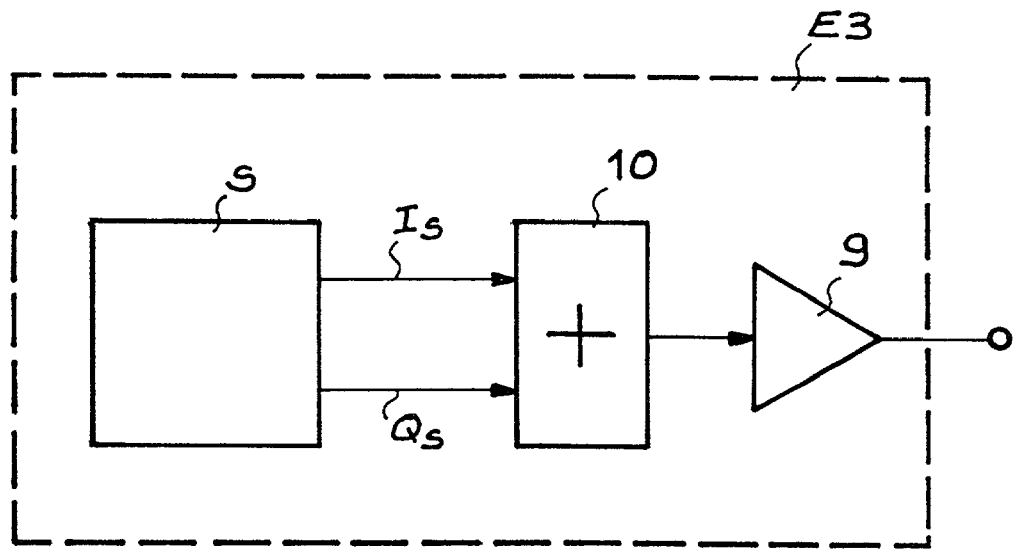
Figure 6:
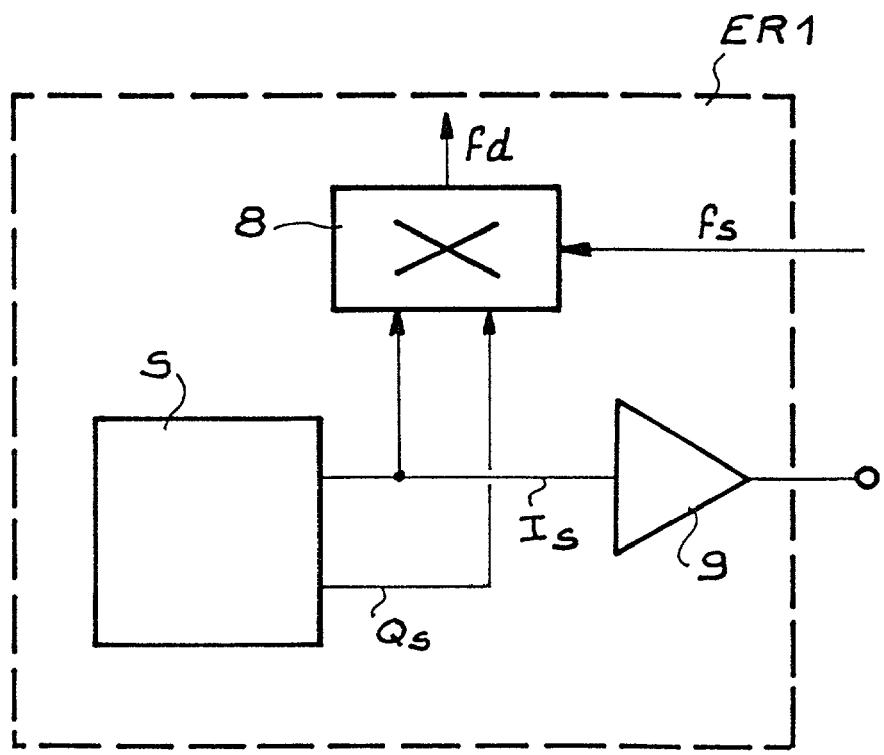
Figure 6:
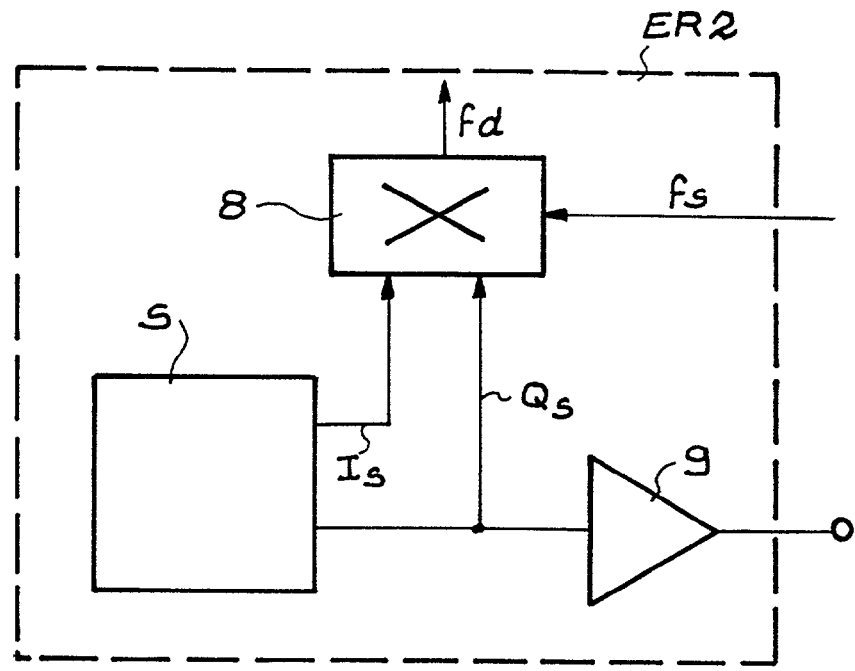
Figure 6:
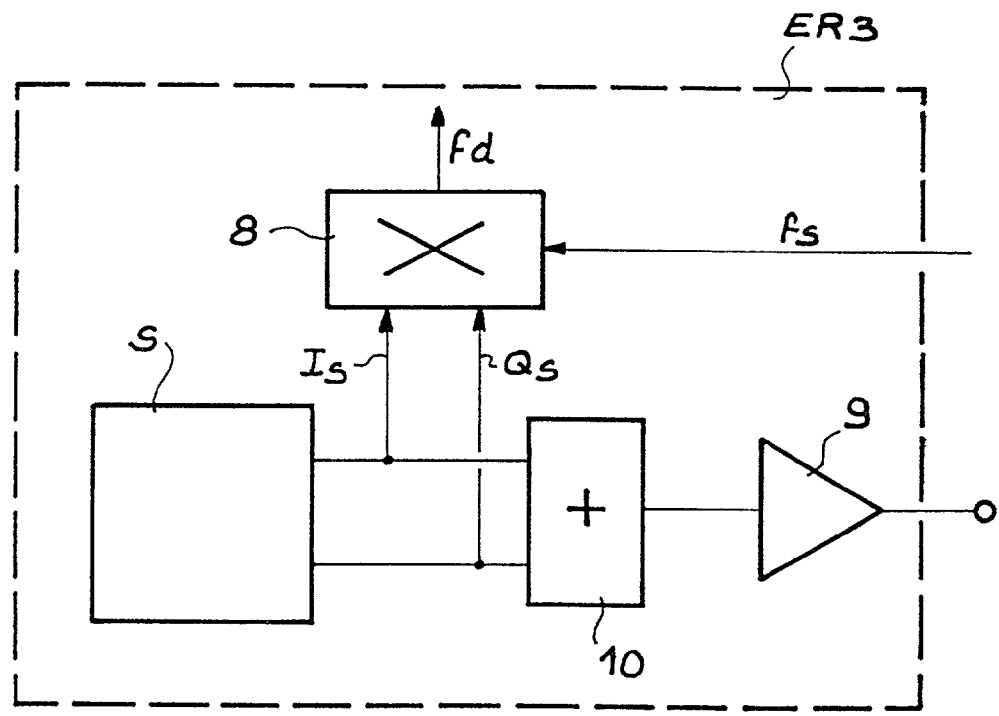
Figure 7:
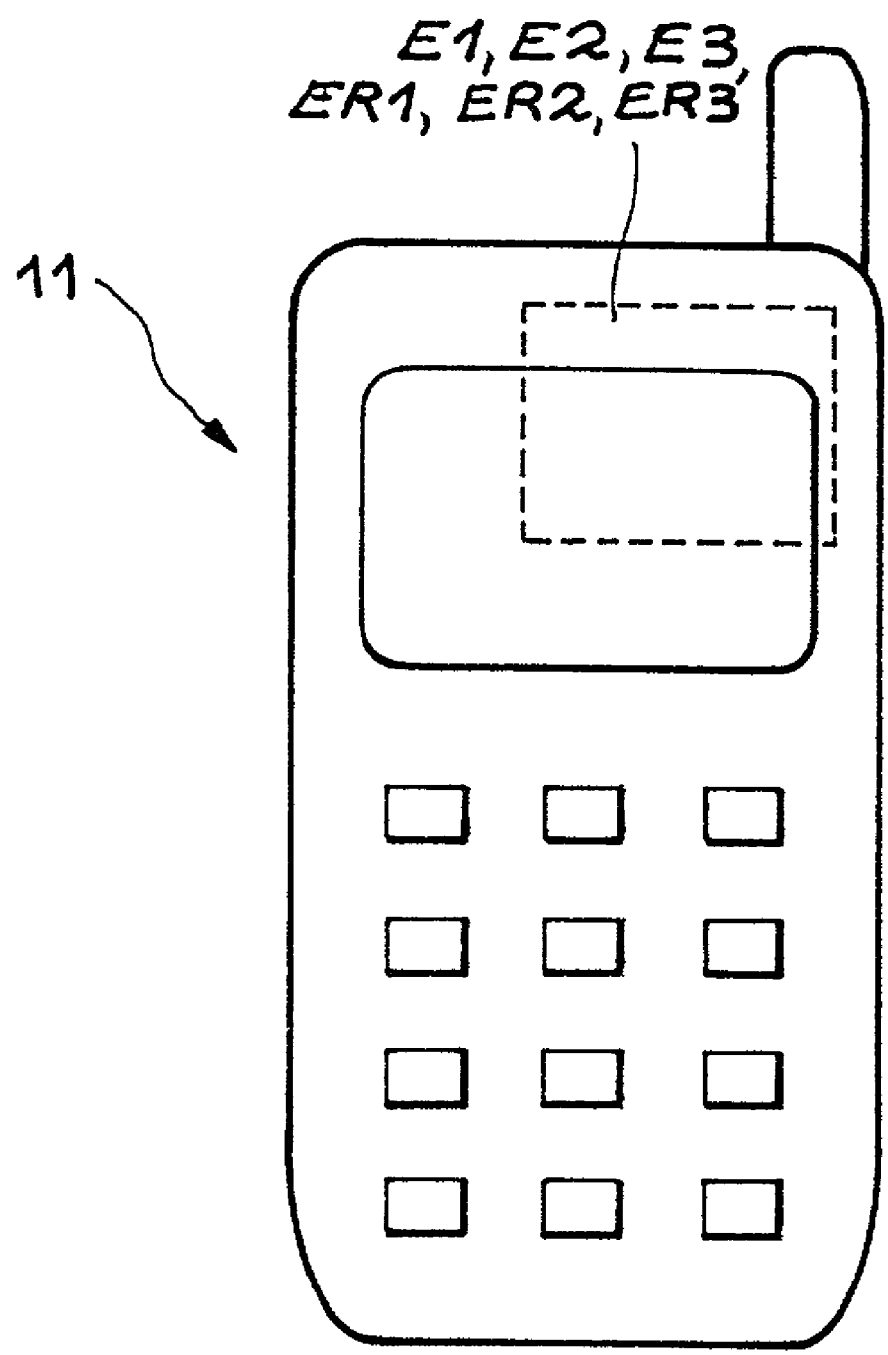

FIGS. 5A, 5B, and 5C show three possible embodiments of a signal transmission circuit according to the invention, FIGS. 6A, 6B, and 6C show three possible embodiments of a transmission/reception circuit according to the invention, and FIG. 7 shows a telephone device according to the invention.

The same elements have been given the same reference symbols throughout the Figures.

DETAILED DESCRIPTION OF EMBODIMENTS OF THE INVENTION

Figure 1:
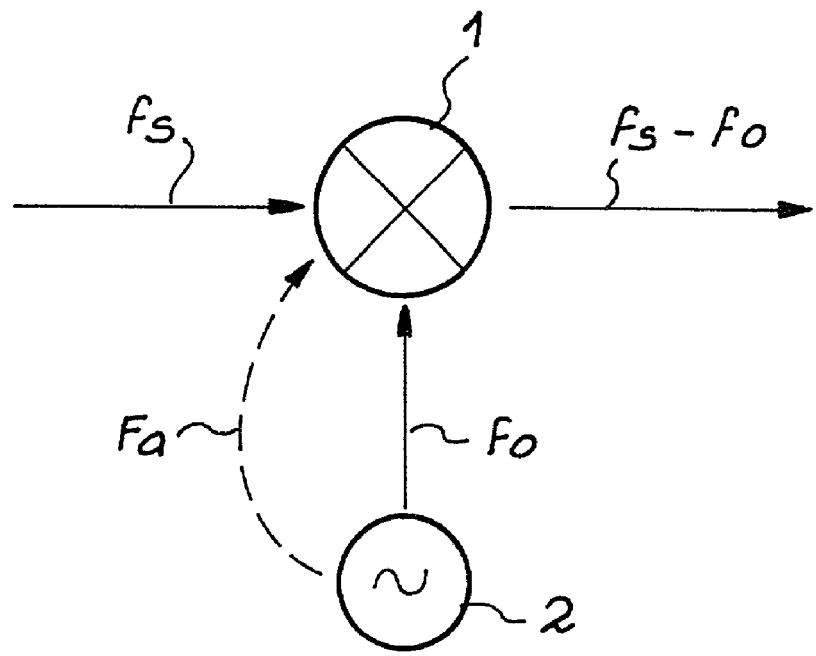
FIG. 1 shows a frequency conversion circuit according to the prior art.
Figure 2:
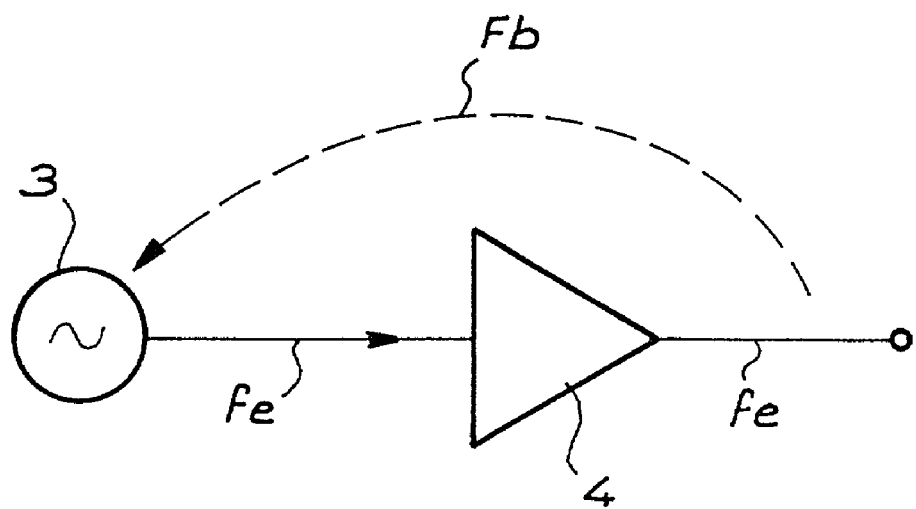
FIG. 2 shows a signal transmission circuit according to the prior art.

FIGS. 1 and 2 have been discussed above and will accordingly not be described again.

Figure 3:
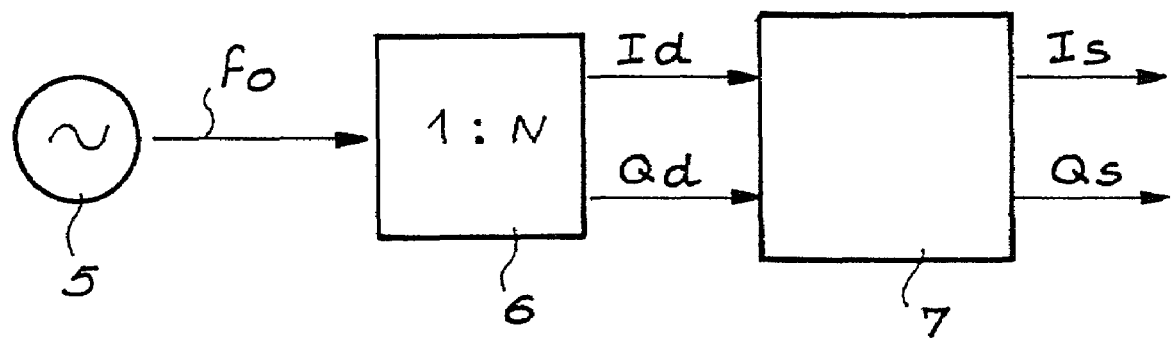
FIG. 3 shows a signal source according to the invention.

FIG. 3 shows a signal source according to the invention. The signal source comprises an oscillator 5, a frequency divider 6, and a polyphase filter 7. The oscillator 5 delivers a reference frequency signal fo which is transmitted to the frequency divider 6. The frequency divider 6 is a divider by N which supplies two quadratic signals Id and Qd, the number N being equal to 2 or to 4·n, n being an integer number. The quadratic signals Id and Qd issued by the divider 6 are substantially square-wave signals having a frequency fo/N whose form factor is substantially equal to 50%. The output signal of the divider 6 is then formed by a sinusoidal signal having a frequency fo/N with harmonics having frequency values m·fo/N, wherein m is an odd number.

According to the invention, the polyphase filter 7 is tuned so that it only transmits a single harmonic having a frequency m·fo/N. Preferably, m=3. The frequency of the signals Is and Qs available at the output of the polyphase filter is then not an integer multiple of the frequency fo of the local oscillator (in fact, since the number m is odd and the number N is even, it follows that the ratio m/N is a fractional number).

As will become apparent further below, the self-mixing effect of the frequency conversion circuit as well as the pulling effect of the transmission circuit are totally eliminated thereby.

Figure 4:
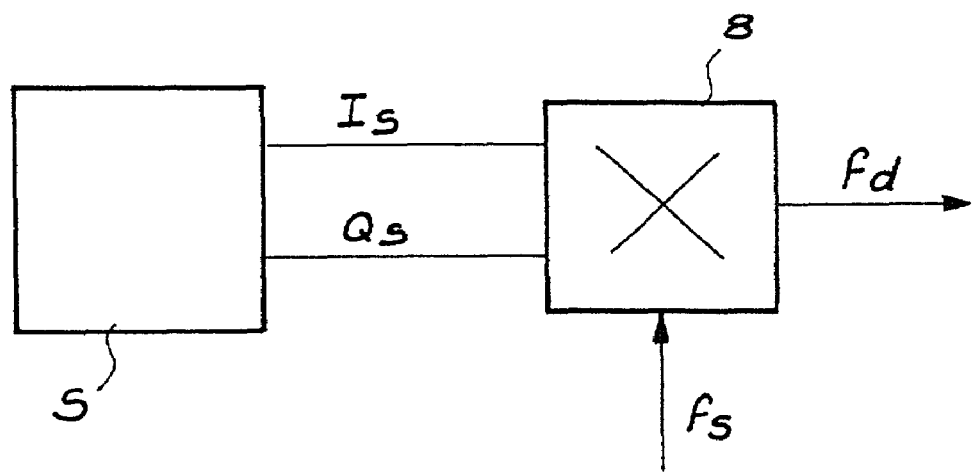
FIG. 4 shows a frequency conversion circuit according to the invention.

FIG. 4 shows a frequency conversion circuit according to the invention.

This conversion circuit comprises a signal source S and a mixer 8. The source S is formed by a local oscillator 5, a frequency divider 6, and a polyphase filter 7 as described with reference to FIG. 3. The mixer 8 receives on the one hand the frequency signal fs containing the information to be detected and on the other hand the reference signal supplied by the source S and formed by the quadratic signals Is and Qs.

The source S supplies a signal whose frequency has no harmonic relationship with the frequency of the local oscillator 5. The self-mixing effect is fully eliminated thereby.

The isolation of the conversion circuit may thus be improved, for example, by a value of the order of 20 dB.

FIGS. 5A, 5B, and 5C show three possible embodiments of a signal transmission circuit according to the invention.

The transmitter of the solid-state type comprises a signal source S as described with reference to FIG. 3 and an amplifier 9. The transmission circuit E1 in FIG. 5A represents the case in which the zero-phase component Is forms the input signal of the amplifier 9, and the transmission circuit E2 in FIG. 5B shows the case in which the component Qs, shifted in phase by π/2 with respect to the component Is, forms the input signal of the amplifier 9. The signals Is and Qs may also be added in a summation unit 10 so as to form only a single input signal for the amplifier 9, as is shown in FIG. 5C (transmission circuit E3). The amplitude of the signal at the input of the amplifier 9 is then increased by means of a multiplication factor equal to $\sqrt{2}$.

The frequency of the input signal of the amplifier has no harmonic relationship with the frequency of the reference oscillator 5. It follows that the pulling effect is fully eliminated.

FIGS. 6A, 6B, and 6C show three possible embodiments of a transmission/reception circuit according to the invention. The transmission/reception circuit according to the invention finds a particularly advantageous application in systems which are generally denoted TDMA systems (TDMA meaning "Time-Division Multiple Access").

The transmission/reception circuit ER1 shown in FIG. 6A comprises a transmission circuit as shown in FIG. 5A and a frequency conversion circuit as shown in FIG. 4.

The transmission/reception circuit ER2 shown in FIG. 6B comprises a transmission circuit as shown in FIG. 5B and a conversion circuit as shown in FIG. 4.

The transmission/reception circuit ER3 shown in FIG. 6C comprises a transmission circuit as shown in FIG. 5C and a conversion circuit as shown in FIG. 4.

The same source S is shared by the transmission circuit and by the conversion circuit in each of the circuits ER1, ER2, and ER3.

FIG. 7 shows a telephone device according to the invention.

The telephone device 11, for example a mobile telephone, contains a transmission circuit according to the invention, such as a circuit E1, E2, or E3, or a transmission/reception circuit according to the invention, such as a circuit ER1, ER2 or ER3.

The invention claimed is:

1. A signal source (S) comprising a local oscillator (5) for generating a reference frequency signal f, characterized in that it comprises: a frequency divider by N (6) connected to the local oscillator (5) and intended to deliver two quadratic square-wave signals (Id, Qd) at a frequency fo/N,N being equal to 2 or 4·n, n being an integer number, and a polyphase filter (7) connected directly to the frequency divider (6) for receiving said two quadratic squre-wave signals and for supplying two sinusoidal quadratic signals (Is, Qs) at a frequency equal to m·fo/N on the basis of the quadratic signals (Id, Qd) issued by the frequency divider (6), in being an odd number.

2. A signal source as claimed in claim 1, characterized in that m=3.

3. A frequency conversion circuit comprising a mixer (8) and a reference frequency signal source (S), characterized in tat the signal source (S) is a source as claimed in claim 1.

4. A signal transmission circuit (E1, E2, E3) comprising a signal source (S) for delivering a signal at a transmission frequency and an amplifier (9) for amplifying the signal issued by the signal source (S), characterized in that the signal source (S) is a source as claimed in claim 1.

5. A transmission/reception circuit (ER1, ER2, ER3) comprising a signal transmission circuit and a frequency conversion circuit, comprising a signal source (S) as claimed in claim 1, characterized in that the same signal source (S) is common to the transmission circuit and to the frequency conversion circuit.

6. A telephone device (11) comprising a transmission circuit, characterized in that the transmission circuit (E1, E2, E3) is a circuit as claimed in claim 4.

7. A telephone device (11) comprising a transmission/reception circuit, characterized in that the transmission/reception circuit (ER1, ER2, ER3) is a circuit as claimed in claim 5.

8. A method of forming two quadratic sinusoidal signals (Is, Qs) from a frequency signal fo, comprising the following steps: the formation of two square-wave quadratic signals (Id, Qd) at a frequency fo/N,N being equal to 2 or 4·n, wherein n is an integer number, and the formation of two sinusoidal quadratic signals (Is, Qs) at a frequency equal to m·fo/N from the two quadratic square-wave signals (Id, Qd) in a polyphase filter (7) connected directly to a frequency divider (6), m being an odd number.

9. A method for direct conversion of a frequency signal fs into a frequency signal fd, comprisings: a method of forming two quadratic sinusoidal signals (Is, Qs) as claimed in claim 8, and a step of mixing each of the two quadratic sinusoidal signals (Is, Qs) with the frequency signal fs so as to deliver the frequency signal fd.

10. A method of forming a transmission signal, comprising: a method of forming two quadratic sinusoidal signals (Is, Qs) as claimed in claim 8, and a step of amplifying at least one of the two sinusoidal quadratic signals (Is, Qs) so as to form the transmission signal.

* * * * *